United States Patent [19]
Nishimori et al.

[11] Patent Number: 5,222,041
[45] Date of Patent: Jun. 22, 1993

[54] DATA AMPLIFYING SYSTEM IN SEMICONDUCTOR MEMORY DEVICE

[75] Inventors: Miki Nishimori, Nagoya; Hidenori Nomura, Kasugai, both of Japan

[73] Assignee: Fujitsu VLSI Limited, Kasugai, Japan

[21] Appl. No.: 735,004

[22] Filed: Jul. 25, 1991

[30] Foreign Application Priority Data

Aug. 3, 1990 [JP] Japan .................................. 2-207167

[51] Int. Cl.[5] .................................................. G11C 7/00
[52] U.S. Cl. ................................. 365/189.01; 365/204; 365/207
[58] Field of Search ............... 365/207, 208, 226, 203, 365/204, 530

[56] References Cited

U.S. PATENT DOCUMENTS

| | | | |
|---|---|---|---|
| 4,780,854 | 10/1988 | Watanabe et al. | 365/226 |
| 4,954,992 | 9/1990 | Kumanoya et al. | 365/189.01 |
| 4,962,326 | 10/1990 | Parkinson et al. | 365/203 |
| 5,144,585 | 7/1992 | Min et al. | 365/226 |

FOREIGN PATENT DOCUMENTS 217992 3/1986 Japan .
19582 1/1989 Japan .
185896 11/1989 Japan .

*Primary Examiner*—Eugene R. LaRoche
*Assistant Examiner*—Vu Le
*Attorney, Agent, or Firm*—Armstrong, Westerman, Hattori, McLeland & Naughton

[57] ABSTRACT

A data amplifying system in a semiconductor memory includes a current mirror circuit for receiving, via a data bus, an input signal corresponding to data read out from a memory cell via a pair of bit lines and for amplifying the input signal. The current mirror circuit operates on the basis of a power supply voltage. An amplitude limit circuit receives an operation voltage and limits the amplitude of the input signal on the data bus to a predetermined potential range on the basis of the operation voltage. A bit line reset potential generator generates a bit line reset potential and applies the bit line reset potential to the bit lines and the amplitude limit circuit. The bit line reset voltage is lower than the power supply line and serves as the operation voltage applied to the amplitude limit circuit.

6 Claims, 6 Drawing Sheets

DATA AMPLIFYING SYSTEM IN SEMICONDUCTOR MEMORY DEVICE

BACKGROUND OF THE INVENTION (1) Field of the Invention

The present invention generally relates to dynamic random access memory devices, and more particularly to an improvement in a data read system thereof. More specifically, the present invention is concerned with a circuit for amplifying data read out to a pair of data bus lines from a memory cell via a pair of bit lines.

(2) Description of the Related Art

Recently, a current-mirror circuit has been used as an amplifier for amplifying data read out to a pair of data bus lines in order to rapidly read out data from a memory cell via a pair of bit lines and send the data to a circuit of the next stage.

FIG. 1 shows a current-mirror circuit 2 for amplifying data read out to a pair of data bus lines DB and $\overline{DB}$ and peripheral circuits thereof in a dynamic random access memory device. Data stored in a memory cell 1a or 1b is read out to the pair of data bus lines DB and $\overline{DB}$ when a word line WL1 or WL2 is switched to a high level and a column select signal C1 applied to gates of transistors Tr16 and Tr17 is switched to a high level. The readout data is applied, as complementary input signals IN and $\overline{IN}$, to the current mirror circuit 2.

As shown in FIG. 1, the current mirror circuit 2 is composed of two P-channel field effect transistors Tr11 and Tr12, and three N-channel field effect transistors Tr13, Tr14 and Tr15. These field effect transistors are, for example, MOS transistors. The current mirror operation is realized by the transistors Tr11–Tr14. The input signals IN and $\overline{IN}$ are applied to the gates of the transistors Tr13 and Tr14, respectively. While an enable signal C2 is being applied to the gate of the transistor Tr15, the current mirror amplifier 2 amplifies the input signals IN and $\overline{IN}$, and generates complementary output signals OUT and $\overline{OUT}$ via the drains of the transistors Tr13 and Tr14.

An N-channel field effect transistor Tr1 is connected between a high-potential power supply line Vcc and the data bus line DB, and an N-channel field effect transistor Tr2 is connected between the power supply line Vcc and the data bus line $\overline{DB}$. The transistors Tr1 and Tr2 form an amplitude limiting circuit 3. The gates of the transistors Tr1 and Tr2 are connected to the Vcc line, so that the transistors Tr1 and Tr2 are always ON.

A description will now be given of the operation of the circuit shown in FIG. 1 with reference to FIG. 2A. While no complementary input signals are read out to the data bus lines DB and $\overline{DB}$, the potentials of the data buses DB and $\overline{DB}$, that is, the input signals IN and $\overline{IN}$ are maintained at a potential equal to Vcc−VthN where VthN is a threshold voltage of each of the transistors Tr1 and Tr2. For example, when Vcc=5 V and VthN≈1 V, the input signals IN and $\overline{IN}$ are maintained at approximately 4 V.

In this state, when the word line WL1 or WL2 becomes the high level and the column select signal C1 becomes the high level, data read out to a pair of bit lines BL and $\overline{BL}$ from the selected memory cell 1a or 1b is sensed and amplified by a sense amplifier SA. Then, amplified data is transferred to the data bus DB and $\overline{DB}$, so that the potential of the input signal $\overline{IN}$ on the low-level side decreases slightly. Meanwhile the input signal IN is not significantly changed, as shown in FIG. 2A.

When the enable signal C2 is input to the current mirror circuit 2, it pulls an output signal OUT up to a potential near the voltage Vcc and pulls an output signal $\overline{OUT}$ down to a potential nearly equal to zero volt on the basis of the potentials of the input signals IN and $\overline{IN}$. In this way, the readout data on the pair of data bus lines DB and $\overline{DB}$ is amplified, and output, as the complementary output signals OUT and $\overline{OUT}$, to a circuit of the next stage.

As indicated by a curve S shown in FIG. 2B, the current mirror circuit 2 operates most rapidly when the input signals are approximately equal to half the power supply voltage Vcc supplied to the current mirror circuit 2. Meanwhile, as indicated by a curve G shown in FIG. 2B, the current mirror circuit 2 has a maximum gain when the input signals IN and $\overline{IN}$ are lower than Vcc/2.

As has been described previously, the input signals IN and $\overline{IN}$ are maintained at (Vcc−VthN) equal to, for example, 4V, which is much higher than Vcc/2. In this state, the current mirror circuit 2 does not operate rapidly and does not have a large gain, as shown in FIG. 2B. Thus, the ability of the current mirror circuit 2 is not utilized completely. The current mirror circuit 2 has another disadvantage in that it stops the amplifying operation when the power supply voltage Vcc decreases momentarily due to noise and the input signals IN and $\overline{IN}$ momentarily become higher than the power supply voltage Vcc. In this case, it takes a long time for the current mirror circuit 2 to return to the normal amplifying operation after the power supply voltage Vcc returns to the normal level. Thus, the current mirror circuit 2 does not operate rapidly.

SUMMARY OF THE INVENTION

It is a general object of the present invention to provide an improved data amplifying system in which the above-mentioned disadvantages are eliminated.

A more specific object of the present invention is to provide a data amplifying system capable of efficiently amplifying data read out to a pair of data bus lines by means of a current mirror circuit.

The above-mentioned objects of the present invention are achieved by a data amplifying system in a semiconductor memory comprising: current mirror circuit means for receiving, via a data bus, an input signal corresponding to data read out from a memory cell via a pair of bit lines and for amplifying the input signal, the current mirror circuit means operating on the basis of a power supply voltage; amplitude limit means for receiving an operation voltage and for limiting an amplitude of the input signal on the data bus to a predetermined potential range on the basis of the operation voltage; and bit line reset potential generating means, coupled to the bit lines and the amplitude limit means, for generating a bit line reset potential and for applying the bit line reset potential to the bit lines and the amplitude limit means, the bit line reset voltage being lower than the power supply line and serving as the operation voltage applied to the amplitude limit means.

The above-mentioned objects of the present invention are also achieved by a data amplifying system in a semiconductor memory comprising: current mirror circuit means for receiving, via a data bus, an input signal corresponding to data read out from a memory cell via a pair of bit lines and for amplifying the input signal, the current mirror circuit means operating on the basis of a power supply voltage; amplitude limit means for receiving an operation voltage and for limiting an amplitude of the input signal on the data bus to a predetermined potential range on the basis of the operation voltage; and generating means, coupled to the amplitude limit means, for generating the operation voltage from the power supply voltage, the operation voltage being approximately half the power supply voltage.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
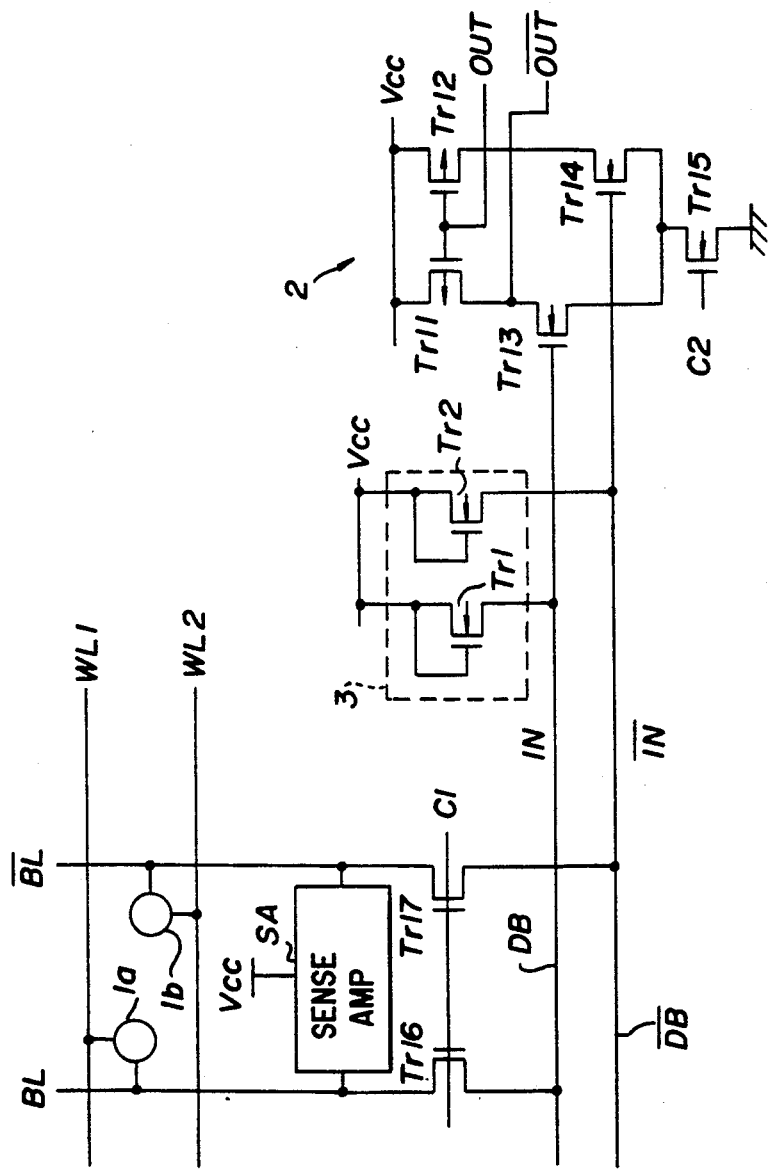
FIG. 1 is a circuit diagram of a related data read system provided in a semiconductor memory device.
Figure 2A:
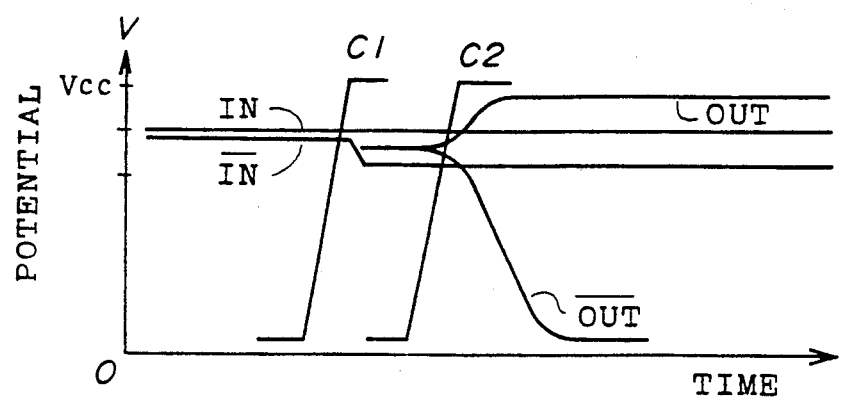
FIG. 2A is a waveform diagram illustrating the operation of the data amplifying system shown in FIG. 1.
Figure 2B:
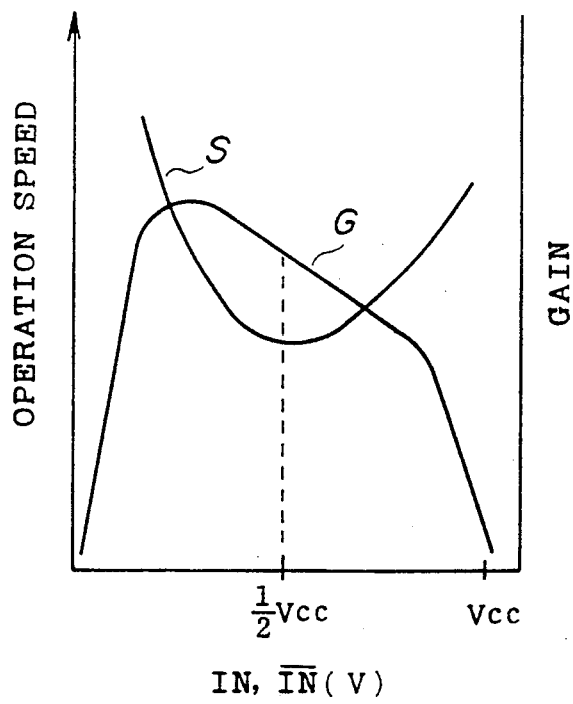
FIG. 2B is a graph showing the characteristics of a current mirror circuit shown in FIG. 1.
Figure 3:
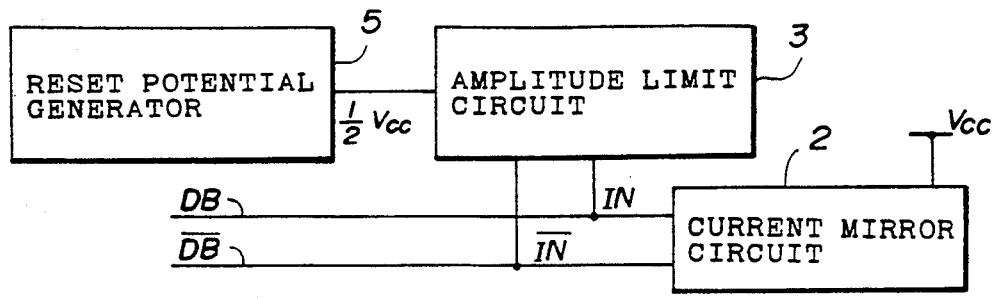
FIG. 3 is a block diagram of an outline of the present invention.

FIG. 3 shows an outline of the present invention. A data amplifying system shown in FIG. 3 is composed of a bit line reset potential generator 5 in addition to the aforementioned current mirror circuit 2 and the amplitude limiting circuit 3. When the power supply voltage applied to the current mirror amplifier 2 is equal to Vcc and this power supply voltage Vcc is also used as a power supply voltage applied to the sense amplifier and other circuits, the bit line reset potential generator 5 generates a potential approximately equal to Vcc/2, which is applied to not only the bit lines BL and $\overline{BL}$ but also the amplitude limiting circuit 3. Thus, the data bus lines DB and $\overline{DB}$ are set to a potential close to Vcc/2, so that the current-mirror circuit 2 operates more rapidly and has a larger gain than those of the circuit shown in FIG. 1.

Figure 4:
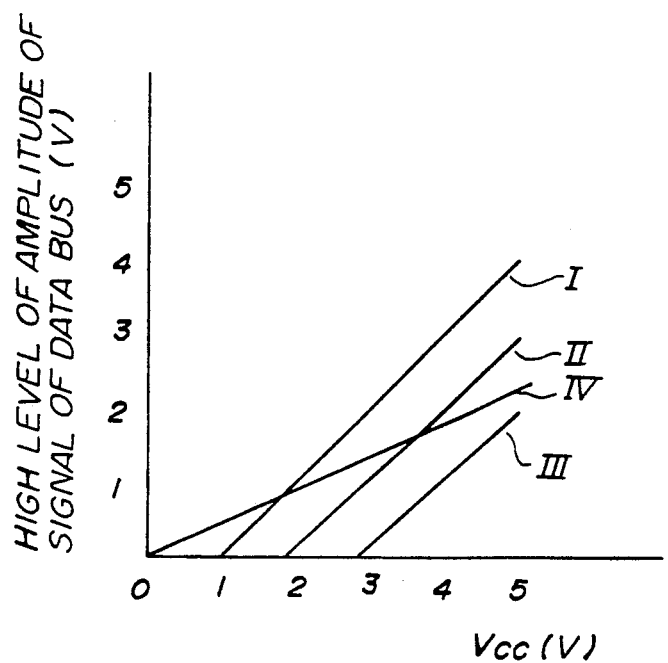
FIG. 4 is a graph showing relationships between a data bus potential and a power supply voltage.

FIG. 4 shows relationships between the power supply voltage Vcc and the potential of each of the data bus lines DB and $\overline{DB}$ (data bus potential). A line I shows a change in the data bus potential obtained in the circuit shown in FIG. 1. A line II shows a change in the data bus potential obtained when two transistors are connected in series between the Vcc line and each of the data bus lines DB and $\overline{DB}$ in order to reduce the potentials of the data bus lines DB and $\overline{DB}$. A line III shows a change in the data bus potential obtained when three transistors are connected in series between the Vcc line and each of the data bus lines DB and $\overline{DB}$ for the same purpose as described above. A line IV shows a change in the data bus potential obtained in the configuration shown in FIG. 3. The potentials of the data bus lines DB and $\overline{DB}$ are set close to Vcc/2, as shown in the line IV. Thus, according to the present invention, the current mirror circuit 2 operates rapidly, as compared with the other configurations related to the curves I, II and III. It is possible to reduce the potentials of the data bus lines DB and $\overline{DB}$ by using a plurality of transistors connected in series, as shown in the curve II or III. In the cases of the curves II and III, it is possible to set the data bus reset potential to Vcc/2 for Vcc=5 V, so that the current mirror circuit 2 has a sufficient gain and operates at a high speed. However, when the power source voltage Vcc decreases to about 2.5 V, the current mirror circuit 2 does not operate in the case related to the curve III, and the data bus potential too decreases, so that the characteristics of the current mirror circuit 2 degrade. On the other hand, in the case related to the curve IV, the data bus potential is equal to Vcc/2 irrespective of the real value of the power source voltage Vcc, so that the current mirror circuit 2 has a high gain and a high operation speed. Thus, according to the present invention, the current mirror circuit 2 operates more rapidly than the other configurations.

Figure 5:
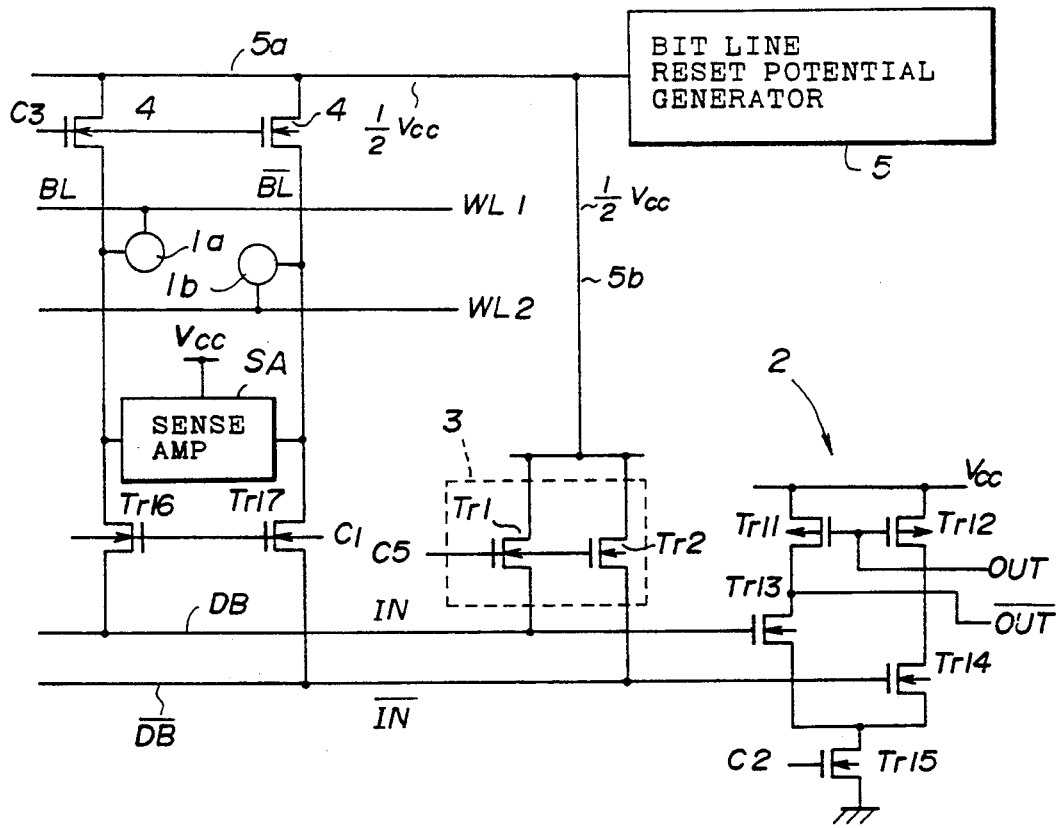
FIG. 5 is a block diagram showing the configuration shown in FIG. 3 in more detail.

FIG. 5 shows the configuration shown in FIG. 3 in more detail. In FIG. 5, those parts which are the same as those shown in the previously described figures are given the same reference numerals. The bit lines BL and $\overline{BL}$ are coupled to a reset potential line 5a via respective transistors 4. A bit line reset signal C3 is applied to the gates of the transistors 4. The voltage equal to Vcc/2 generated by the bit line reset potential generator 5 is applied to the drains of the transistors 4 via the reset potential line 5a. The drains of the transistors Tr1 and Tr2 are coupled to a data bus control line 5b extending from the bit line reset potential generator 5. The potential equal to Vcc/2 is applied to the drains of the transistors Tr1 and Tr2 via the data bus control line 5b. That is, the transistors Tr1 and Tr2 operate while they receive Vcc/2 as the power supply voltage.

Figure 6:
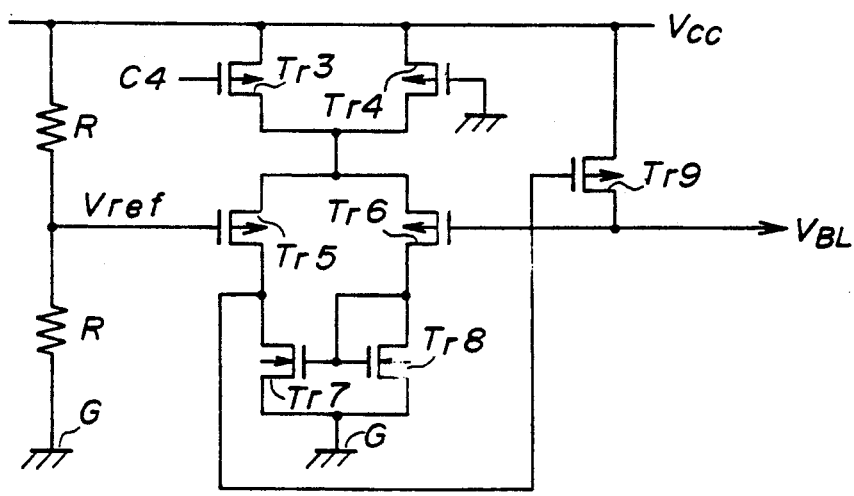
FIG. 6 is a circuit diagram of a bit line reset potential generator shown in FIGS. 3 and 5.

FIG. 6 is a circuit diagram of the bit line reset potential generator 5, which is made up of field effect transistors Tr3–Tr9 and two resistors R. The sources of the P-channel transistors Tr3 and Tr4 are connected to the Vcc line. An enable signal C4 is applied to the gate of the transistor Tr3, while the gate of the transistor Tr4 is grounded. The drains of the transistors Tr3 and Tr4 are connected to the sources of the transistors Tr5 and Tr6, which form a current mirror circuit together with the transistors Tr7 and Tr8. The gate of the transistor Tr5 is connected to a node where the two resistors R are connected in series between the Vcc line and ground G. The two resistors R have an identical resistance, and thus Vcc/2 is applied, as a reference voltage Vref, to the gate of the transistor Tr5. The gate of the transistor Tr6 is connected to the drain of the transistor Tr9, which generates an output signal $V_{BL}$ equal to Vcc/2. The source of the transistor Tr9 is connected to the Vcc line, and the gate thereof is connected to the drain of the transistor Tr5. The sources of the transistors Tr7 and Tr8 are grounded.

During the time when the enable signal C4 is maintained at the high level, the drain of the transistor Tr9 is maintained at the Vcc/2. When the bit line reset potential $V_{BL}$ decreases from Vcc/2, the gate potential of the transistor Tr6 decreases from Vcc/2, so that the current driving ability of the transistor Tr6 becomes greater than that of the transistor Tr5. Thus, the drain potential of the transistor Tr8 and the gate potentials of the transistors Tr7 and Tr8 increase slightly, and the drain potential of the transistor Tr7 and the gate potential of the transistor Tr9 decrease slightly. As a result, the current driving ability of the transistor Tr9 increases, so that the bit line reset potential $V_{BL}$ is restored to Vcc/2.

Figure 7A:
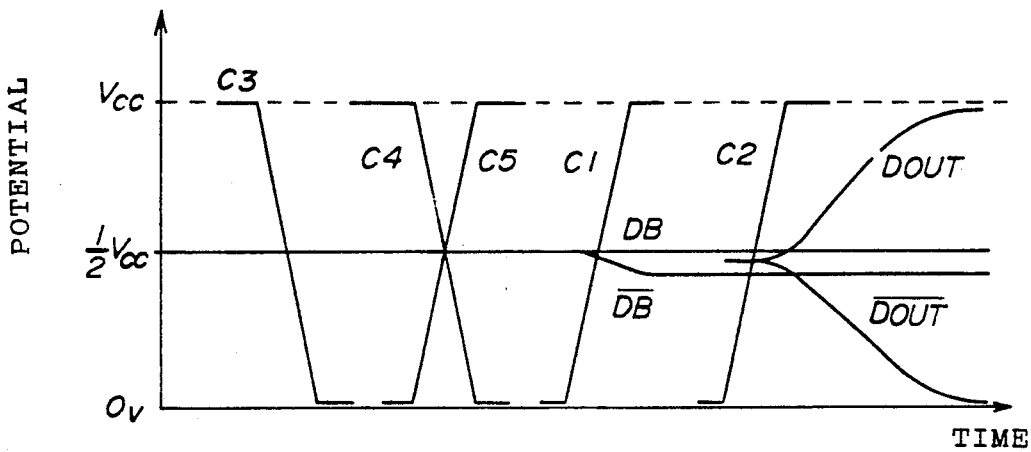
FIGS. 7A and 7B are respectively waveform diagrams showing the operation of the configuration shown in FIG. 5.

A description will now be given of the operation of the circuit shown in FIG. 5 with reference to FIGS. 7A and 7B. FIG. 7A shows the operation obtained when the data bus lines DB and $\overline{DB}$ become active, and FIG. 7B shows the operation obtained when the data bus lines DB and $\overline{DB}$ are reset.

During the data bus activating operation, the bit line reset signal C3 is switched from the high level to the low level. It should be noted that the potentials of the data bus lines DB and $\overline{DB}$ are maintained at a potential close to Vcc/2 by the amplitude limiting circuit 3 which receives the Vcc/2 power supply voltage. Then, the enable signal C4 is switched to the low level, and the enable signal C5 is switched to the high level. After that, the column select signal C1 is switched to the high level from the level. Data which is read out from the selected memory cell 1a or 1b and amplified by the sense amplifier SA is transferred to the data bus lines DB and $\overline{DB}$. Thus, a potential difference between the data bus lines DB and $\overline{DB}$ occurs, as shown in FIG. 7A. In the case shown in FIG. 7A, the potential of the data bus line $\overline{DB}$ decreases slightly. Then, the enable signal C2 is switched to the high level, so that the current mirror circuit 2 is activated. The activated current mirror amplifier 3 rapidly amplifies the potential difference between the data bus lines DB and $\overline{DB}$, so that the output signal OUT becomes the high level, and the output signal $\overline{OUT}$ becomes the low level.

Figure 7B:
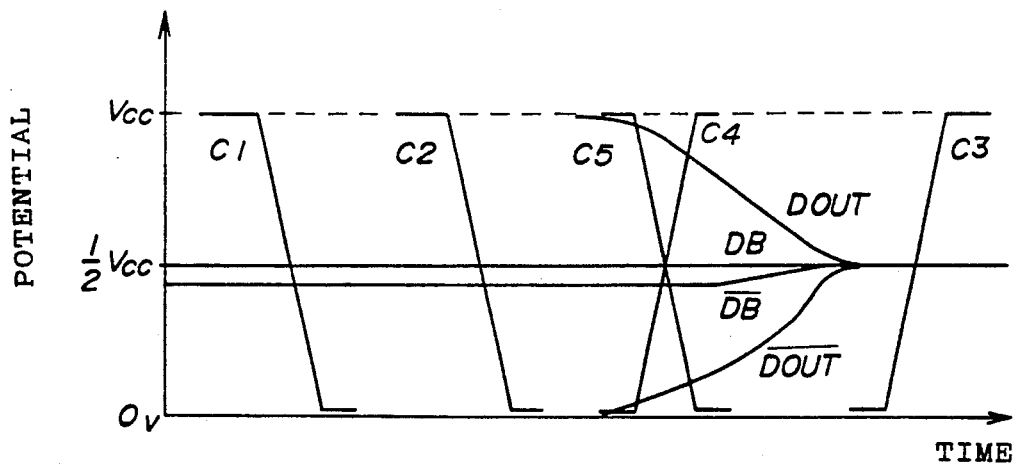

Referring to FIG. 7B, the column select signal C1 is switched to the low level in the state where the potential difference between the data bus lines DB and $\overline{DB}$ is maintained. Then, the enable signal C2 is switched to the low level, so that the current mirror circuit 3 is made inactive. After that, the enable signal C5 is switched to the low level, and the enable signal C4 is switched to the high level. In response to this switching operation, the output signals OUT and $\overline{OUT}$ converge to the potential close to Vcc/2, and the potentials of the data bus lines DB and $\overline{DB}$ converge to the potential close to Vcc/2. Thereafter, the bit line reset signal C3 is switched to the high level.

As has been described above, since the voltage approximately equal to Vcc/2 is always applied to the amplitude limiting circuit 3, the input signals IN and $\overline{IN}$ are limited to a potential close to Vcc/2. Thus, as shown in FIG. 3, the current mirror amplifier 2 operates more rapidly and has a larger gain. In addition, as a result of the potential difference between the power supply voltage Vcc and the data bus potential, it is possible to prevent a decrease in the operation speed of the current mirror circuit 2 due to noise.

Figure 8:
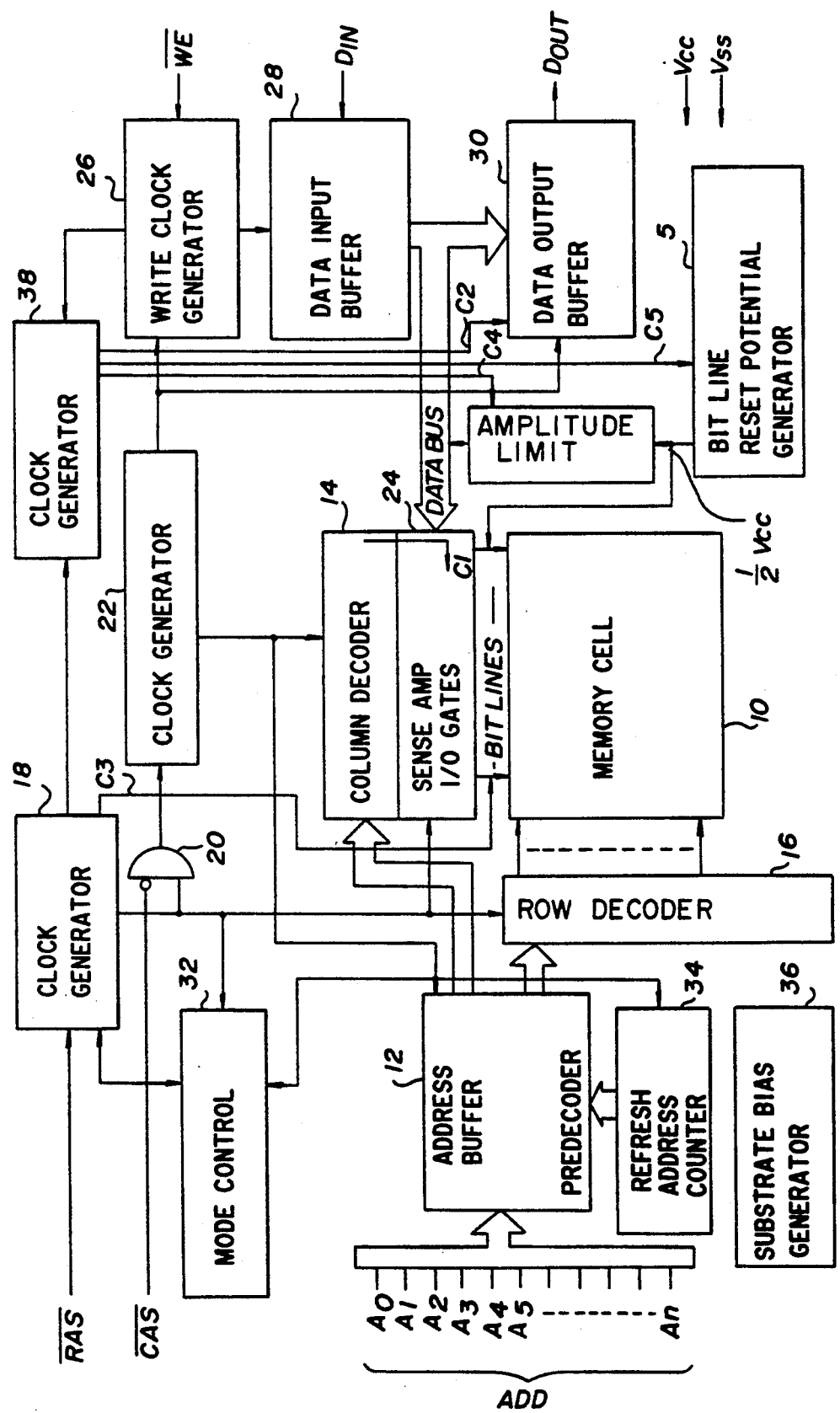
FIG. 8 is a block diagram of a dynamic random access memory using the present invention.

FIG. 8 is a block diagram of a dynamic random access memory (DRAM) which employs a data amplifying system according to the present invention. The DRAM includes a memory cell array 10, which has a plurality of memory cells arranged into a matrix and coupled to word lines and bit lines.

A multiplexed address signal ADD consisting of address bits $A_0$ to $A_n$ is input to an address buffer/predecoder 12, which generates a column address signal to be supplied to a column address decoder 14 and a row address signal to be supplied to a row address decoder 16. A row address strobe signal $\overline{RAS}$ from an external device (not shown), such as a central processing unit (CPU), is input to a clock generator 18, which generates a clock signal to be supplied to the row address decoder 16. The row address strobe signal $\overline{RAS}$ is a low-active signal and defines a timing at which at least one of the word lines is selected by the row address decoder 16, and a timing at which at least a selected one of the word lines is released from the selected state. The row address strobe signal $\overline{RAS}$ defines a timing at which the word lines are precharged and a timing at which the word lines are reset. A sense amplifier and input/output gate 24 is connected to the column address decoder 14 and the memory cell array 10.

A column address strobe signal $\overline{CAS}$ from the external device is input to an AND gate 20 through an inverter. The clock signal from the clock generator 18 is applied to the AND gate 20, an output signal of which is input to a clock generator 22. In response to the column address strobe signal $\overline{CAS}$, the clock generator 22 generates a clock signal to be supplied to the column address decoder 14 as well as the address buffer/predecoder 12. When receiving the clock signal from the clock generator 22, the column address decoder 14 selects a corresponding one of pairs of bit lines or more. The sense amplifier and input/output gate 24 are coupled to the bit lines extending to the memory cell array 10. When writing data Din into the memory cell array 10 or reading out data Dout therefrom, the data is amplified by the sense amplifier SA (FIG. 5) provided in the sense amplifier and input/output gate 24.

A write clock generator 26 receives the clock signal from the clock generator 22 and a write enable signal $\overline{WE}$ supplied from the external device, and generates a write clock. A data input buffer 28 inputs data Din at a timing defined by the write clock supplied from the write clock generator 26. Data output from the data input buffer 28 is input to the sense amplifier and input/output gate 24 and is written into the memory cell array 10. Data output from the sense amplifier and input/output gate 24 is input to a data output buffer 30, which outputs the input data in synchronism with the clock signal from the clock generator 22. A mode controller 32 receives the column address strobe signal $\overline{CAS}$ and the clock signal from the clock generator 18, and generates a mode signal corresponding to predetermined conventional operation modes, such as read-/write modes. The mode signal from the mode controller 32 is input to a refresh address counter 34, which generates an address signal relating to a memory cell to be refreshed. A substrate bias generator 36 generates a substrate bias voltage.

A clock generator 38 receives clock signals from the clock generator 18 and the write clock generator 26, and generates the aforementioned enable signals C2, C4 and C5. The column select signal C1 is generated by the column decoder 14. The bit line reset signal C3 is generated by the clock generator 18. The bit line reset potential generator 5 generates the voltage equal to Vcc/2, which is supplied to the amplitude limiting circuit 3 and the transistors Tr4 (FIG. 5). The data bus includes the data bus lines DB and $\overline{DB}$. The memory cells 1a and 1b shown in FIG. 5 are included in the memory cell array 10. The sense amplifier SA and the transistors Tr16 and Tr17 shown in FIG. 5 are included in the block 24.

The present invention is not limited to the specifically disclosed embodiments, and variations and modifications may be made without departing from the scope of the present invention.

What is claimed is:

1. A data amplifying system in a semiconductor memory, comprising:

current mirror circuit means for receiving, via a data bus, an input signal corresponding to data read out from a memory cell via a pair of bit lines and for amplifying said input signal, said current mirror circuit means being connected to a power supply line having a power supply voltage;

amplitude limiting means for receiving an operation voltage and for limiting an amplitude of said input signal on said data bus to a predetermined potential range on the basis of said operation voltage; and bit line reset potential generating means, coupled to said bit lines and said amplitude limiting means, for generating a bit line reset potential to said bit lines and said amplitude limiting means, wherein a bit line reset voltage is lower than said power supply voltage supplied from said power supply line and serving as said operation voltage applied to said amplitude limiting means.

2. A data amplifying system as claimed in claim 1, wherein:

said bit line reset potential generating means comprises means for generating said bit line reset potential from said power supply voltage; and said operation voltage corresponding to said bit line reset potential is approximately half of said power supply voltage.

3. A data amplifying system as claimed in claim 1, wherein said amplitude limiting means comprises:

a first field effect transistor having a drain receiving said operation voltage lower than said power supply voltage, a source connected to a first line of said data bus, and a gate receiving a predetermined enable signal; and a second field effect transistor having a drain receiving said operation voltage, a source coupled to a second line of said data bus, and a gate receiving said predetermined enable signal.

4. A data amplifying system as claimed in claim 1, wherein said bit line reset potential generating means comprises:

a first transistor having a source receiving said power supply voltage, a gate receiving a predetermined enable signal, and a drain;

a second transistor having a source receiving said power supply voltage, a gate grounded, and a drain;

reference voltage generating means for generating a reference voltage approximately half said power supply voltage from said power supply voltage;

a third transistor having a source coupled to the drains of said first and second transistors, a gate receiving said reference voltage, and a drain;

a fourth transistor having a source coupled to the drains of said first and second transistors, a gate, and a drain;

a fifth transistor having a drain coupled to the drain of said third transistor, a source grounded, and a gate;

a sixth transistor having a drain coupled to the drain of said fourth transistor, a source grounded, and a gate connected to the gate of said fifth transistor, the gates of said fifth and sixth transistors being connected to the drain of one of the fifth and sixth transistors; and a seventh transistor having a source receiving said power supply voltage, a gate connected to the drain of one of said fifth and sixth transistors, and a drain coupled to the gate of the fourth transistor, said bit line reset potential being obtained at the drain of said seventh transistor.

5. A data amplifying system as claimed in claim 1, wherein said current mirror circuit means comprises:

a first transistor having a source receiving said power supply voltage, a drain and a gate;

a second transistor having a source receiving said power supply voltage, a gate connected to the gate of said first transistor, and a drain;

a third transistor having a drain connected to the drain of said first transistor, a gate receiving a first component of said input signal, and a source;

a fourth transistor having a drain connected to the drain of said second transistor, a gate receiving a second component of said input signal, and a source; and a fifth transistor having a drain connected to the sources of said third and fourth transistors, a gate receiving a predetermined enable signal, and a source grounded, amplified output signals being obtained at the drains of said third and fourth transistors.

6. A data amplifying system in a semiconductor memory comprising:

current mirror circuit means for receiving, via a data bus, an input signal corresponding to data read out from a memory cell via a pair of bit lines and for amplifying said input signal, said current mirror circuit means operating on the basis of a power supply voltage;

amplitude limiting means for receiving an operation voltage and for limiting an amplitude of said input signal on said data bus to a predetermined potential range on the basis of said operation voltage; and generating means, coupled to said amplitude limiting means, for generating said operation voltage from said power supply voltage, said operation voltage being approximately half said power supply voltage.

* * * * *